(12) United States Patent
Asami et al.

(10) Patent No.: US 9,299,531 B2
(45) Date of Patent: Mar. 29, 2016

(54) MASK COVER, CHARGED PARTICLE BEAM DRAWING APPARATUS AND CHARGED PARTICLE BEAM DRAWING METHOD

(71) Applicant: NUFLARE TECHNOLOGY, INC., Kanagawa (JP)

(72) Inventors: Yu Asami, Shizuoka (JP); Michihiro Kawaguchi, Shizuoka (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 66 days.

(21) Appl. No.: 14/257,641

(22) Filed: Apr. 21, 2014

(65) Prior Publication Data
US 2014/0319372 A1 Oct. 30, 2014

(30) Foreign Application Priority Data
Apr. 24, 2013 (JP) ................................. 2013-091143

(51) Int. Cl.
*G01N 21/00* (2006.01)
*H01J 37/02* (2006.01)
*H01J 37/317* (2006.01)
*H01J 37/30* (2006.01)

(52) U.S. Cl.
CPC ........... *H01J 37/026* (2013.01); *H01J 37/3002* (2013.01); *H01J 37/3174* (2013.01)

(58) Field of Classification Search
CPC ... H05K 1/0215; G03F 7/707; G03F 7/70708; G03F 7/70716; G03F 7/70725; G03F 7/70733; G03F 7/70691; H01L 21/683; H01L 21/6831; H01L 21/6833

USPC ................. 250/453.11, 454.11, 492.1, 492.2, 250/492.3
See application file for complete search history.

(56) References Cited

U.S. PATENT DOCUMENTS

| | | | | |
|---|---|---|---|---|
| 5,452,177 | A * | 9/1995 | Frutiger .............. | H01L 21/6831 279/128 |
| 2002/0047093 | A1* | 4/2002 | Son ........................ | G01N 23/04 250/307 |
| 2007/0228525 | A1* | 10/2007 | Yamanaka ............. | B82Y 10/00 257/621 |
| 2008/0054195 | A1* | 3/2008 | Tachikawa ............. | B82Y 10/00 250/492.22 |
| 2010/0103583 | A1* | 4/2010 | Wang ...................... | H01J 37/28 361/234 |

FOREIGN PATENT DOCUMENTS

| | | |
|---|---|---|
| JP | 4-280415 A | 10/1992 |
| JP | 10-92715 A | 4/1998 |
| JP | 2005-32963 A | 2/2005 |
| JP | 2007-266362 A | 10/2007 |

* cited by examiner

*Primary Examiner* — Jack Berman
*Assistant Examiner* — Jason McCormack
(74) *Attorney, Agent, or Firm* — Patterson & Sheridan, LLP.

(57) ABSTRACT

A mask cover according to one embodiment of the present invention comprises a frame body having an opening at the center, a conductive earth plate installed on the frame body such that its end protrudes into the opening of the frame body, an earth pin provided on the end of the earth plate and electrically connected to the earth plate, and a conductive cover part surrounding the earth pin such that the tip end of the earth pin protrudes and a gap is present between the cover part and the earth pin.

12 Claims, 6 Drawing Sheets

MASK COVER, CHARGED PARTICLE BEAM DRAWING APPARATUS AND CHARGED PARTICLE BEAM DRAWING METHOD

CROSS REFERENCE TO RELATED APPLICATIONS

This application is based upon and claims the benefit of priority from the prior Japanese Patent Application No. 2013-091143 filed in Japan on Apr. 24, 2013; the entire contents of which are incorporated herein by reference.

FIELD

The present invention relates to a mask cover, a charged particle beam drawing apparatus and a charged particle beam drawing method.

BACKGROUND

An electron beam drawing apparatus as an exemplary charged particle beam drawing apparatus draws on a mask substrate in which a Cr film as alight shielding film and a resist film are stacked on a surface of a glass substrate as mask, for example, by irradiating with an electron beam. At this time, the mask substrate is charged by irradiating with the electron beam. When the mask substrate is charged, a trajectory of an electron beam is bent due to an electric field formed by the charged mask substrate, and the electron beam is irradiated on a position misaligned from a position to be radiated. Consequently, a drawing accuracy deteriorates. Thus, a mask cover having an earth mechanism with a grounded earth pin is placed on the mask substrate such that the earth pin of the earth mechanism penetrates through the resist film and contacts the Cr film. Drawing is performed on the mask substrate with the grounded Cr film, deterioration in drawing accuracy is suppressed.

However, there is a problem that particles are generated when the earth pin penetrates through the resist film, and the generated particles adhere to the surface of the mask substrate. Adhesion of particles to the mask substrate causes drift of the electron beam and pattern error, which deteriorates a drawing accuracy.

DETAILED DESCRIPTION

A mask cover according to one embodiment of the present invention comprises a frame body having an opening at the center, a conductive earth plate installed on the frame body such that its end protrudes into the opening of the frame body, an earth pin provided on the end of the earth plate and electrically connected to the earth plate, and a conductive cover part surrounding the earth pin such that the tip end of the earth pin protrudes and a gap is present between the cover part and the earth pin.

A charged particle beam drawing apparatus according to the embodiment of the present invention comprises a first chamber for placing, on a mask in which a resist film is formed on a light shielding film, a mask cover having a frame body with an opening at the center, a conductive earth plate installed on the frame body such that its end protrudes into the opening of the frame body, an earth pin provided at the end of the earth plate and electrically connected to the earth plate, and a conductive cover part surrounding the earth pin such that the tip end of the earth pin protrudes and a gap is present between the cover part and the earth pin, and a second camber comprising an electrode for grounding the earth pin contacting the light shielding film, and irradiating the mask on which the mask cover is placed with a charged particle beam.

A charged particle beam drawing method according to the embodiment of the present invention comprises by lifting down from above a mask cover which has a frame body with an opening at the center, a plurality of conductive earth plates installed apart from each other on the frame body such that their ends protrude into the opening of the frame body, a plurality of earth pins provided at the ends of the earth plates and electrically connected to the earth plates, and a plurality of conductive cover parts surrounding the earth pins such that the tip ends of the earth pins protrude and gaps are present between the cover parts and the earth pins to a mask in which a resist film is formed on a light shielding film while tilted toward the mask, placing the cover on the mask such that the earth pins sequentially contact the light shielding film of the mask, and irradiating a charged particle beam to the mask while the earth plates are grounded.

The mask cover, the charged particle beam drawing apparatus and the charged particle beam drawing method according to the embodiment of the present invention will be described below.

Figure 1:
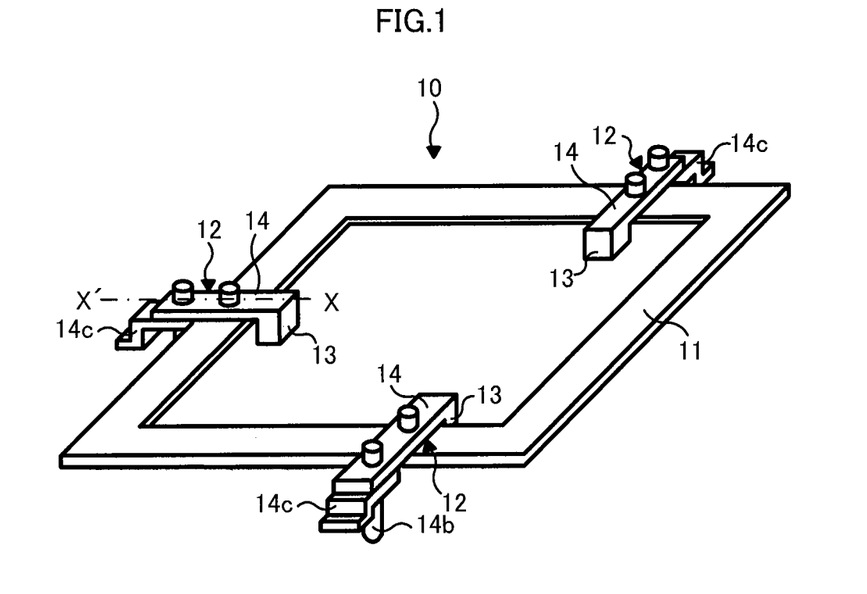
FIG. 1 is a perspective view illustrating a mask cover according to one embodiment of the present invention.

The mask cover according to the embodiment of the present invention will be described with reference to FIG. 1 and FIG. 2. FIG. 1 is a perspective view illustrating the mask cover according to the embodiment of the present invention, and FIG. 2 is a cross-section view of an earth mechanism along the dotted line X-X' of FIG. 1.

A mask cover 10 according to the embodiment of the present invention performs a charge elimination processing on a mask drawn by an electron beam drawing apparatus as an exemplary charged particle beam drawing apparatus. As illustrated in FIG. 1, the mask cover 10 is such that a frame-shaped insulative frame body 11 with an opening at the center is provided with a plurality of earth mechanisms 12.

Figure 2:
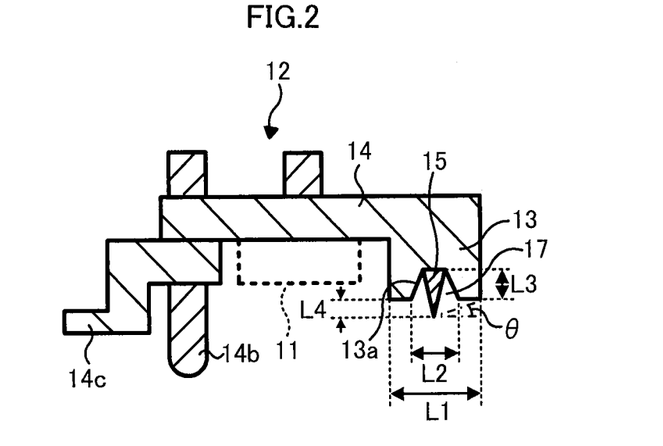
FIG. 2 is a cross-section view of an earth mechanism along the dotted line X-X' of FIG. 1.

As illustrated in FIG. 2, each earth mechanism 12 is made of a conductor such as conductive zirconia, and has an earth plate 14 with a cover part 13 at a first end, and an earth pin 15. In FIG. 2, the frame body 11 of the mask cover 10 is indicated in a dotted line.

The earth plate 14 is a plate-shaped conductor, for example. The earth plate 14 is provided with Two conductors including a support pin 14b which supports the earth plate 14 and is earthed during drawing, and a contact point 14c for confirming whether the mask cover 10 is electrically connected with a mask when the mask cover 10 is placed on the mask.

The earth plate 14 needs to be a conductor in order to electrically connect the earth pin 15 detailed below with the support pin 14b and the contact point 14c, but the earth plate 14 having conductivity and made of a low magnetic material is preferably applied.

That is, eddy current is generated in the earth plate 14 along with the charge elimination processing on the mask on which the mask cover 10 is placed. The eddy current causes a magnetic field, and a trajectory of a charged particle beam such as electron beam irradiated on the mask is bent, and an irradiation position accuracy of the charged particle beam deteriorates. Thus, the earth plate 14 having conductivity and made of a low magnetic material such as $ZrO_2$—TiN, SiC, WC or TiC is applied, thereby lowering an intensity of a magnetic field generated due to eddy current and suppressing a deterioration in irradiation position accuracy of the charged particle beam. Thus, the earth plate 14 which is made of a low magnetic material is preferably applied.

The earth pin 15 is a conductor made of conductive diamond or the like, for example, and is provided at the first end of the earth plate 14 so as to be electrically connected to the earth plate 14.

The cover part 13 is integrally formed with the earth plate 14, and has conductivity, for example. The cover part 13 is provided at the bottom face of the first end of the earth plate 14 so that a tip end of the earth pin 15 protrudes from a bottom face of the cover part 13, has a gap 17 between the cover part 13 and the earth pin 15 to be wider toward the tip end of the earth pin 15, and surrounds the earth pin 15.

In other words, for the structure of the earth pin 15 and the cover part 13, the cover part 13 is provided with a tapered opening 13a down to a predetermined depth position from the bottom face of the cover part 13. Then, the earth pin 15 is provided at the opening 13a of the cover part 13. As described in more detail, the earth pin 15 is provided at the opening 13a such that the gap 17 is provided between the earth pin 15 and the inner face of the opening 13a of the cover part 13, and the tip end of the earth pin 15 is provided at the opening 13a to protrude downward from the bottom face of the cover part 13.

That is, the cover part 13 is provided at the bottom face of the first end of the earth plate 14 such that the whole periphery except the tip end of the earth pin 15 is surrounded and the gap 17 wider toward the tip end of the earth pin 15 is provided between the cover part 13 and the earth pin 15.

When a length L1 of the bottom face of the cover part 13 horizontal to the longitudinal direction of the earth plate 14 is on the order of 2 mm, the opening 13a of the cover part 13 is formed to have a maximum diameter L2 of about 0.5 mm and a depth L3 of about 0.4 mm, for example. A distance L4 between the tip end of the earth pin 15 and the bottom face of the cover part 13 is preferably on the order of 0.1 mm, at which the bottom face of the cover part 13 does not contact a mask when the mask cover 10 is placed on the mask.

Assuming a particle dispersion direction as θ as indicated in FIG. 2, dispersion of particles is suppressed as θ is smaller. Herein, θ is expressed as $\theta = \text{Tan}^{-1}\{L4/(L1/2)\}$ by use of the length L1 of the cover part 13 of the earth plate 14 and the height L4 from the bottom face of the cover part 13 to the tip end of the earth pin 15. From the equation, as L4 is smaller or L1 is larger, θ is smaller and dispersion of particles can be further suppressed. A practical value for a drawing apparatus is desirably around L1=2 mm and L4=0.1 mm.

The contact point 14c is a conductor made of the same material as the earth plate 14, for example, and is provided to contact the bottom face of a second end opposite to the first end of the earth plate 14.

The support pin 14b is a conductor made of Ti-6Al-4V, Ti, SiC, $ZrO_2$—TiN, WC or TiC, for example, and is provided to penetrate through the second end opposite to the first end of the earth plate 14, and the contact point 14c.

Each of the earth mechanisms 12 is provided on the frame body 11 such that the earth pin 15 and the cover part 13 protrude into the opening of the frame body 11, the support pin 14b and the contact point 14c protrude outward from the frame body 11, and the bottom face of the earth plate 14 contacts the surface of the frame body 11 as illustrated in FIG. 1.

A mask on which the mask cover 10 described above is placed will be described below. In the following description, the mask will be described by way of a mask substrate 20.

Figure 3:
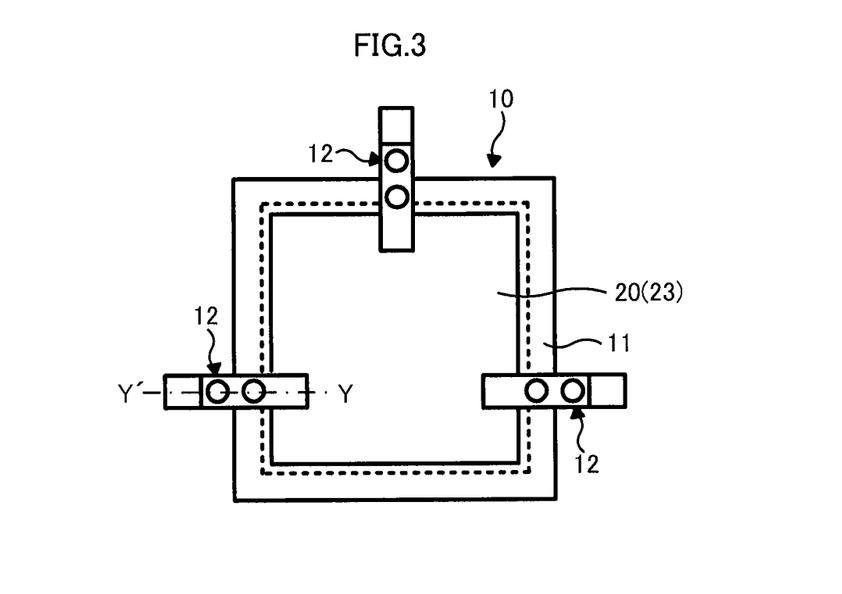
FIG. 3 is a top view illustrating a mask substrate on which the mask cover according to the embodiment of the present invention is placed.
Figure 4:
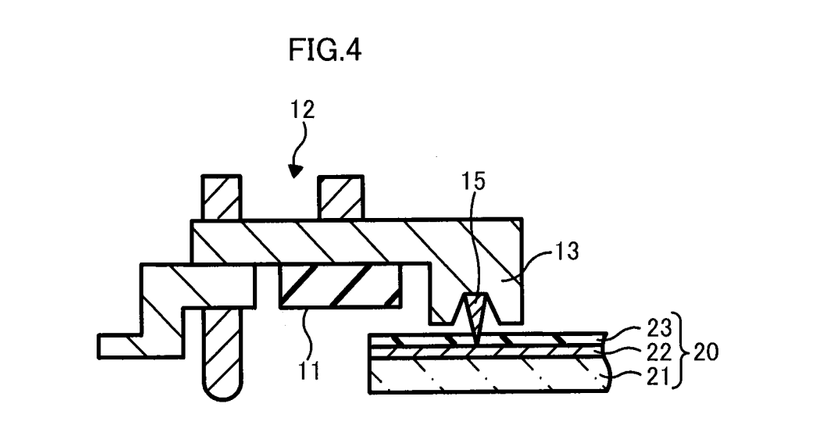
FIG. 4 is a partial cross-section view of the mask substrate along the dotted line Y-Y' of FIG. 3.

FIG. 3 is a top view illustrating the mask substrate 20 on which the mask cover 10 according to the embodiment of the present invention is placed, and FIG. 4 is a partial cross-section view of the mask substrate 20 along the dotted line Y-Y' of FIG. 3. As illustrated in FIG. 3, the mask substrate 20 is square, and as illustrated in FIG. 4, the mask substrate 20 is such that a light shielding film 22 such as Cr film, and a resist film 23 are stacked in this order on the surface of a glass substrate 21.

As illustrated in FIG. 3, the mask cover 10 is placed on the mask substrate 20 such that the frame body 11 covers the surrounding part of the mask substrate 20. The frame body 11 is subjected to a conductive film processing in order to suppress deterioration in drawing accuracy due to a magnetic field, and is preferably made of a low magnetic material with a conductive film formed on its surface. The low magnetic material may employ $AlO_2$, $ZrO_2$, SiC or the like, for example, and the conductive film may employ TiN coating or the like. As illustrated in FIG. 4, the earth pin 15 in each earth mechanism 12 of the mask cover 10 placed on the mask substrate 20 penetrates through the resist film 23 of the mask substrate 20 to contact the light shielding film 22. At this time, the bottom face of the cover part 13 of each earth mechanism 12 is separated from the resist film 23 upwardly. That is, the mask cover 10 is placed on the mask substrate 20 such that the earth pin 15 contacts the light shielding film 22 and the bottom face of the cover part 13 is separated from the resist film 23 upwardly.

The charged particle beam drawing apparatus according to the embodiment of the present invention for drawing on a mask on which the mask cover 10 described above is placed will be described below. In the following description, an electron beam drawing apparatus for drawing on the mask substrate 20 as an exemplary mask will be described as an exemplary charged particle beam drawing apparatus.

Figure 5:
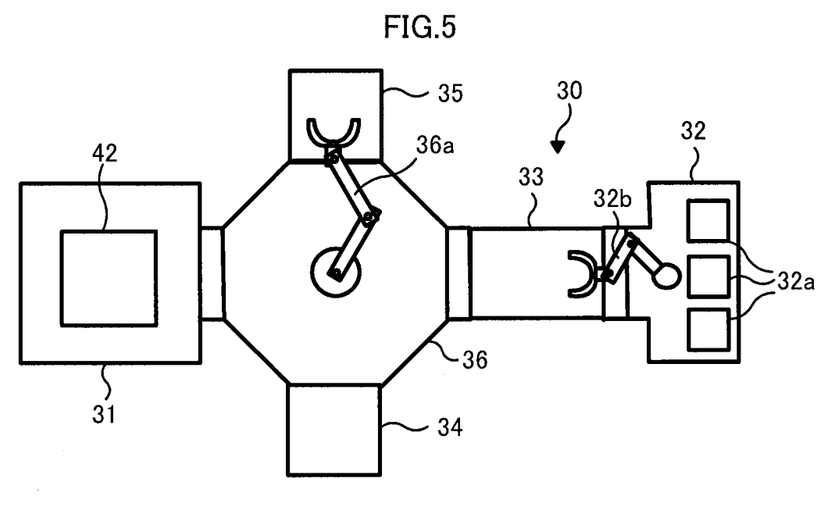
FIG. 5 is a diagram schematically illustrating a structure of an electron beam drawing apparatus according to the embodiment of the present invention.

FIG. 5 is a diagram schematically illustrating a structure of an electron beam drawing apparatus 30 according to the embodiment of the present invention. The electron beam drawing apparatus 30 illustrated in FIG. 5 has a drawing chamber 31 for drawing on the mask substrate 20, a carry-in/out part 32 in which an object to be transferred such as the mask substrate 20 or the mask cover 10 is placed, a load lock chamber 33 capable of switching an atmosphere state and a vacuum state, an alignment chamber 34 for aligning the mask substrate 20, a mask cover housing chamber 35 capable of housing the mask cover 10 therein, and a vacuum robot chamber 36 having a vacuum transferring robot 36a therein.

The carry-in/out part 32 has a plurality of placement parts 32a capable of placing an object to be transferred thereon. The carry-in/out part 32 has an atmosphere transferring robot 32b for transferring an object to be transferred in atmosphere.

The carry-in/out part 32 is able to communicate with the load lock chamber 33. The inside of the load lock chamber 33 is made atmospheric or vacuumed due to air supply or exhaust.

The vacuum robot chamber 36 is installed so as to be able to communicate with the load lock chamber 33. A horizontal cross-section shape of the vacuum robot chamber 36 is substantially octagonal. The vacuum robot chamber 36 has therein a vacuum transferring robot 36a for transferring an object to be transferred in vacuum.

The alignment chamber 34 is installed so as to be communicate with one side substantially perpendicular to the side where the load lock chamber 33 is installed among the eight sides of the vacuum robot chamber 36. The mask cover housing chamber 35 is installed so as to be communicate with a side opposite to the side where the alignment chamber 34 is installed among the eight sides of the vacuum robot chamber 36.

The alignment chamber 34 performs a processing of detecting a position misalignment and a rotation misalignment of the mask substrate 20 to be transferred and correcting the position misalignment and the rotation misalignment of the mask substrate 20, or an alignment processing.

The mask cover housing chamber 35 can house the mask cover 10 therein, and can attach and detach the mask cover 10 to and from the mask substrate 20.

The drawing chamber 31 for drawing on the mask substrate 20 is installed so as to be communicate with one side opposite to the side where the load lock chamber 33 is installed among the eight sides of the vacuum robot chamber 36.

Figure 6:
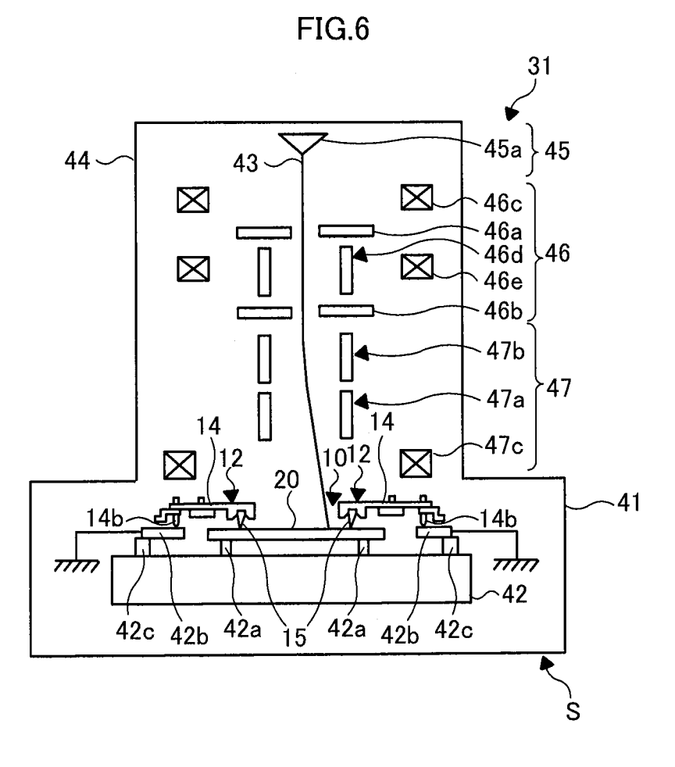
FIG. 6 is a diagram schematically illustrating a structure of a drawing chamber.

FIG. 6 is a diagram schematically illustrating a structure of the drawing chamber 31. As illustrated in FIG. 6, the drawing chamber 31 has a drawing chamber 41, a stage 42 which is provided inside the drawing chamber 41 and on which the mask substrate 20 is placed, and an electronic optical lens tube 44 provided on the top face of the drawing chamber 41 and irradiating a desired position of the mask substrate 20 placed on the stage 42 with an electron beam 43.

The drawing chamber 41 is a substantially cuboid casing made of stainless or inver, for example.

The stage 42 is provided to be movable in a substantially horizontal direction relative to the installation face S of the drawing chamber 31 (the direction will be denoted as XY direction below and a plane containing the XY direction will be denoted as horizontal face) in the drawing chamber 41.

The stage 42 is provided with a plurality of pins 42a for supporting the mask substrate 20 from below. The mask substrate 20 is placed on the pins 42a.

The stage 42 is provided with a plate spring 42b as a grounded electrode and a support body 42c for supporting the plate spring 42b. When the mask substrate 20 is placed on the pins 42a, the support pin 14b as part of each earth mechanism 12 of the mask cover 10 placed on the mask substrate 20 contacts the plate spring 42b. Thereby, the light shielding film 22 (FIG. 4) as a charging film of the mask substrate 20 is electrically connected to the plate spring 42b via the earth pin 15, the earth plate 14 and the support pin 14b to be grounded.

The electronic optical lens tube 44 is a cylinder made of the same material as the drawing chamber 41 such as stainless or inver, and is provided with an electron beam generation part 45, an electron beam shape part 46 and an electron beam deflection part 47 therein in this order from above.

The electron beam generation part 45 emits an electron beam 43. The electron beam generation part 45 has an electron gun 45a for emitting an electron beam 43.

The electron beam shape part 46 shapes a horizontal cross-section shape of the electron beam 43 emitted from the electron beam generation part 45. The electron beam shape part 46 has a first aperture 46a having a rectangular hole and a second aperture 46b provided below the first aperture 46a and having an arrow-shaped hole, for example.

An illumination lens 46c is provided above the first aperture 46a in the electron beam shape part 46. Further, a shape deflector 46d and a projection lens 46e are provided between the first aperture 46a and the second aperture 46b.

The illumination lens 46c is a magnetic lens (which will be denoted as standard lens below) in which the surrounding of a ring-shaped coil is covered with a non-magnetic body having an opening in the ring center direction, and illuminates the hole of the first aperture 46a with an electron beam 43 emitted from the electron beam generation part 45.

The projection lens 46e is also a standard lens like the illumination lens 46c, for example. The projection lens 46e projects the electron beam 43 passing through the hole of the first aperture 46a onto the second aperture 46b.

The shape deflector 46d controls a projection position of the electron beam 43 passing through the hole of the first aperture 46a onto the second aperture 46b.

The electron beam deflection part 47 controls an irradiation position of the electron beam 43 such that the electron beam 43 shaped in the electron beam shape part 46 is irradiated at a predetermined position on the mask substrate 20. The electron beam deflection part 47 has a main objective deflector 47a, and a sub objective deflector 47b provided apart from the main objective deflector 47a upwardly. The main objective deflector 47a is a deflector for determining a position of a sub-field on which an electron beam 43 is irradiated, and the sub objective deflector 47b is a deflector for determining an irradiation position on which an electron beam 43 is irradiated in the sub-field determined by the main objective deflector 47a.

Further, an objective lens 47c is provided below the main objective deflector 47a in the electron beam deflection part 47. The objective lens 47c may employ a magnetic lens (which will be denoted as immersion lens below) in which the surrounding of a ring-shaped coil is covered with a non-magnetic body having an opening below and which has a higher refractive index than a standard lens, for example.

When the objective lens 47c employs an immersion lens described above, the objective lens 47c and the mask substrate 20 placed on the stage 42 can be approached each other, thereby enhancing a resolution of the electron beam drawing apparatus 30. However, the immersion lens and the mask substrate 20 placed on the stage 42 are close to each other, and thus other mechanism cannot be provided therebetween. In the present embodiment, the objective lens 47c employs an immersion lens, and thus a mechanism for pressing the mask substrate 20 onto the stage 42 from above, and an earth mechanism such as earth blade for grounding the mask substrate 20 cannot be provided on the stage 42. Therefore, the mask substrate 20 is grounded by placing the mask cover 10 thereon and is supported by the pins 42a provided on the stage 42 from below thereby to be placed on the stage 42.

The charged particle beam drawing method according to the embodiment of the present invention will be described below. In the following description, an electron beam drawing method for drawing on the mask substrate 20 as an exemplary mask will be described by use of the above-described electron beam drawing apparatus 30 as an exemplary charged particle beam drawing method.

Figure 7:
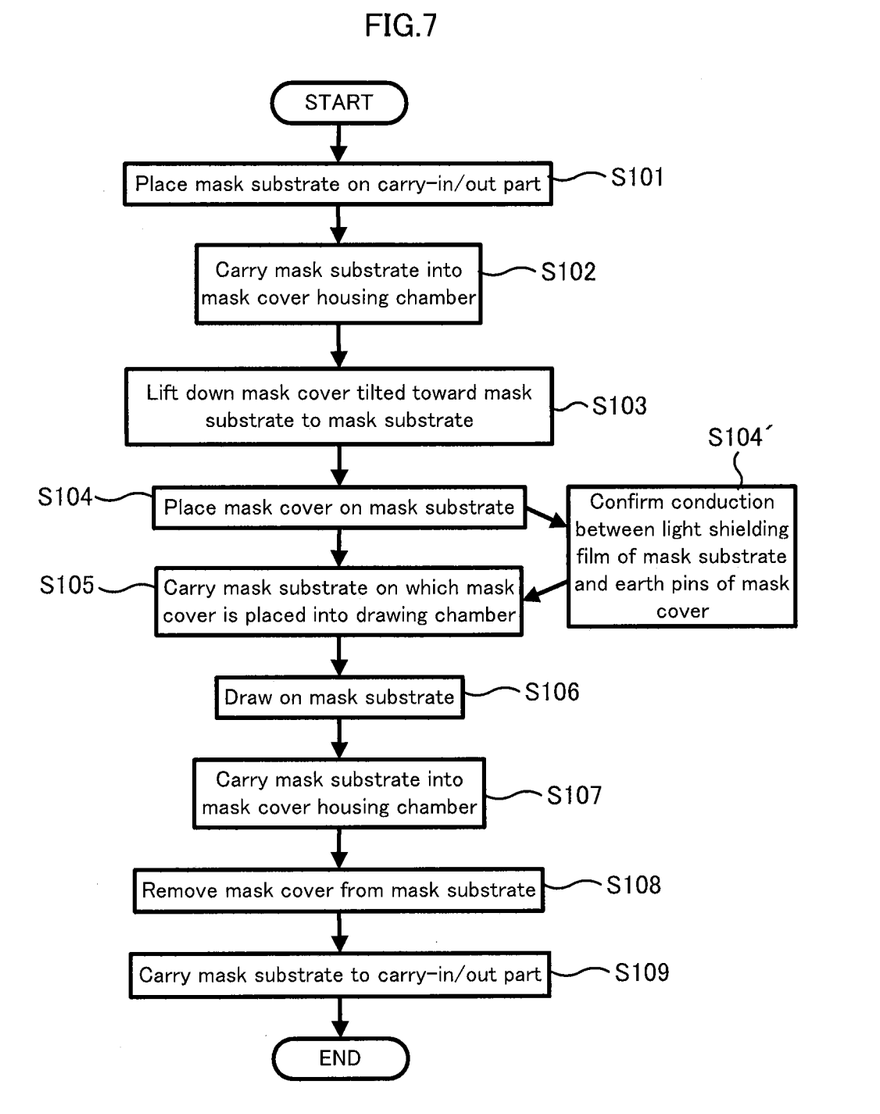
FIG. 7 is a flowchart for explaining an electron beam drawing method according to the embodiment of the present invention.

FIG. 7 is a flowchart for explaining the electron beam drawing method according to the embodiment of the present invention. The mask cover 10 placed on the mask substrate 20 is assumed to be previously housed in the mask cover housing chamber 35.

As illustrated in FIG. 7, at first, the mask substrate 20 is taken out from the mask storage, and is placed on the placement parts 32a of the carry-in/out part 32 (S101).

Subsequently, the mask substrate 20 placed on the placement parts 32a of the carry-in/out part 32 is transferred into the mask cover housing chamber 35 (S102). Specifically, it is performed as follows.

At first, the atmosphere transferring robot 32b is used to transfer the mask substrate 20 placed on the placement parts 32a of the carry-in/out part 32 into the load lock chamber 33. Then, the inside of the load lock chamber 33 is vacuumed to transfer the mask substrate 20 in the load lock chamber 33 into the alignment chamber 34 by use of the vacuum transferring robot 36a. Then, the mask substrate 20 is subjected to the alignment processing in the alignment chamber 34 to transfer the mask substrate 20 subjected to the alignment processing into the mask cover housing chamber 35 by use of the vacuum transferring robot 36a.

Then, the mask cover 10 tilted toward the mask substrate 20 is lifted down on the top face of the mask substrate 20 (S103), and the mask cover 10 is placed on the mask substrate 20 (S104). After the mask cover 10 is placed on the mask substrate 20, conduction between the light shielding film 22 of the mask substrate 20 and the earth pins 15 of the mask cover 10 may be confirmed by use of the contact points 14c provided on the earth plates 14 of the earth mechanisms 12 (S104').

Figure 8:
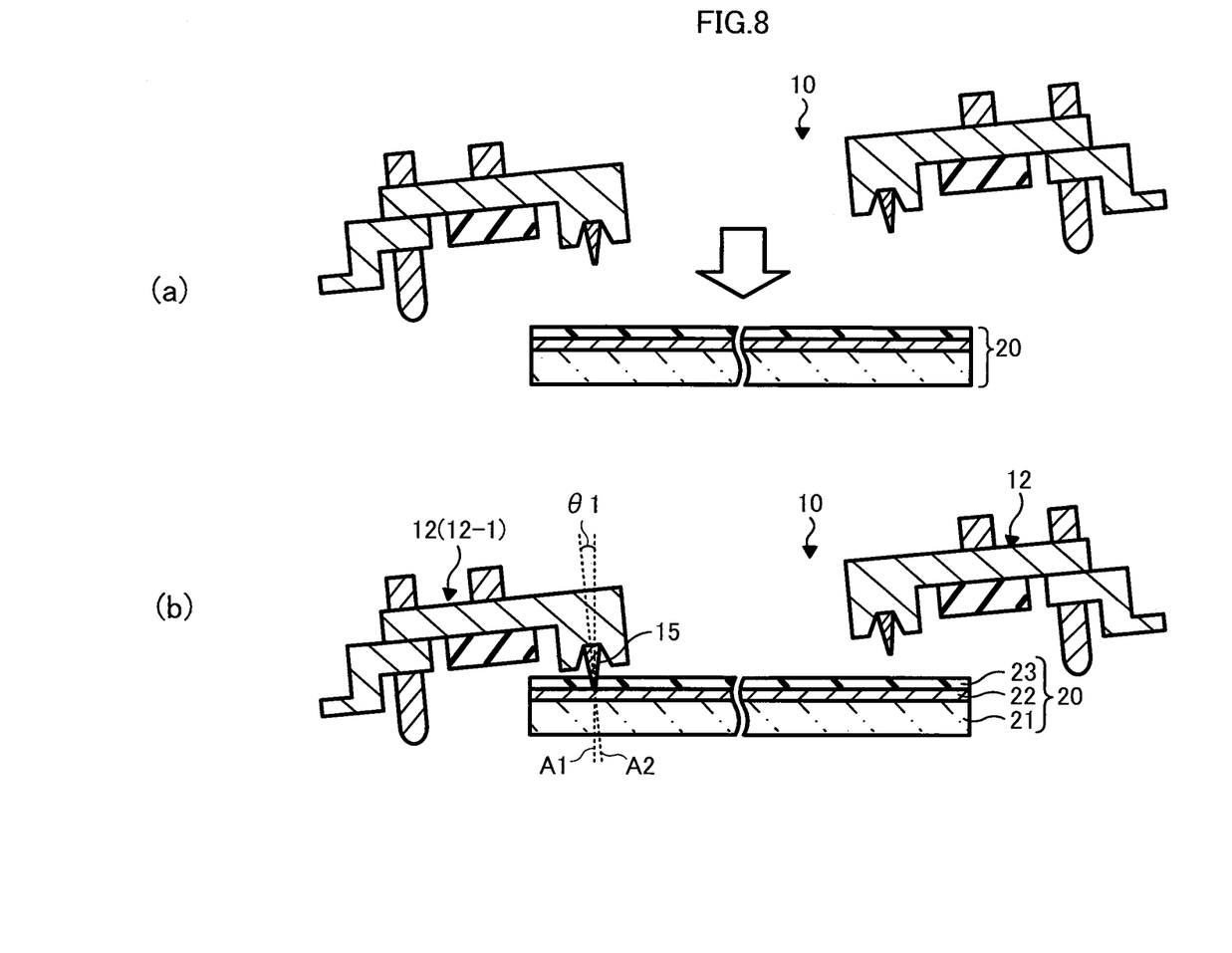
FIG. 8 is a diagram for explaining a mask cover placing method.
Figure 9:
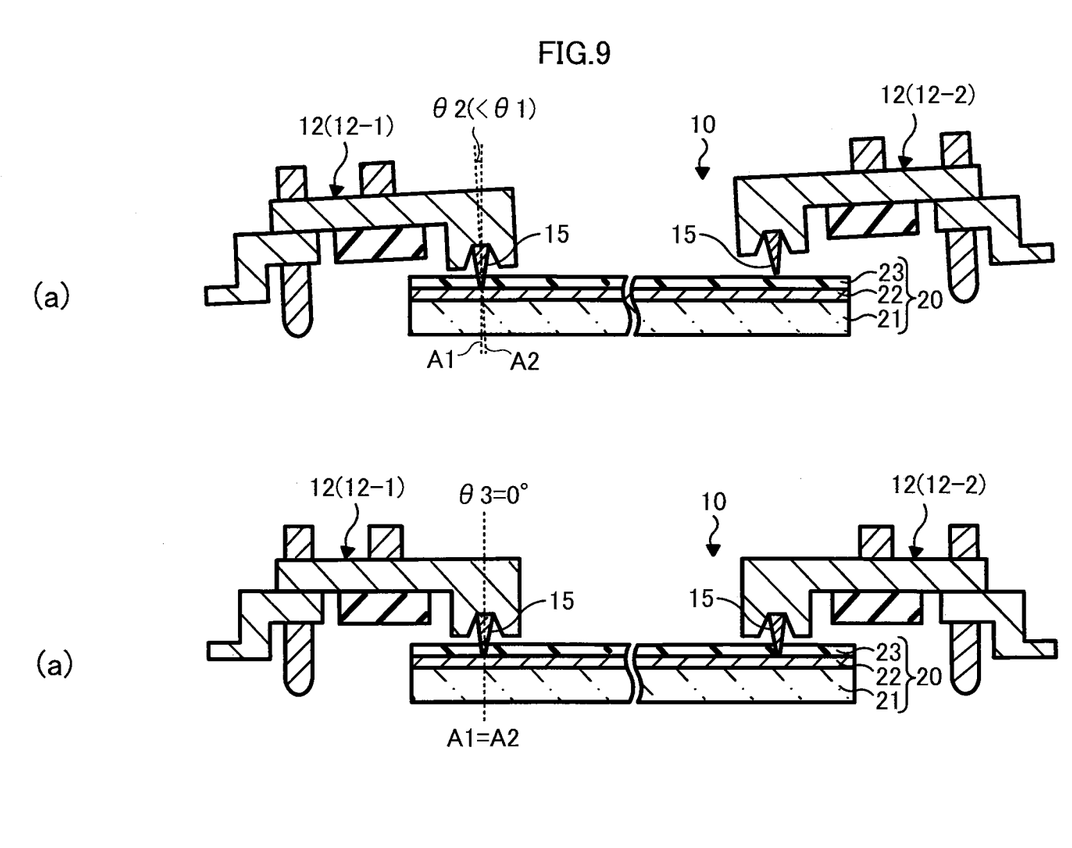
FIG. 9 is a diagram for explaining the mask cover placing method.

A method for placing the mask cover 10 will be specifically described below with reference to FIG. 8 and FIG. 9. FIG. 8 and FIG. 9 are the diagrams for explaining the method for placing the mask cover 10. In each of FIG. 8 and FIG. 9, a size of the mask cover 10 relative to the mask substrate 20 is illustrated to be larger than an actual size for convenience of the description.

At first, as described above, the mask cover 10 tilted toward the mask substrate 20 is lifted down on the mask substrate 20 (FIG. 8(a)). If the tilted mask cover 10 keeps being lifted down, only the earth pin 15 of one earth mechanism 12 among a plurality of earth mechanisms 12 (the earth mechanism 12 will be denoted as first earth mechanism 12-1 in the following description) penetrates through the resist film 23 while tilted toward the mask substrate 20 at an angle θ1, and reaches the light shielding film 22 of the mask substrate 20 (FIG. 8(b)).

The angle θ1 described above is defined as an angle formed by an axis A1 perpendicular to the mask substrate 20 and an axis A2 of the earth pin 15 in the cross-section of the illustrated mask cover 10 and mask substrate 20. An angle described below will be similarly defined.

The mask cover 10 is further lifted down from the state illustrated in FIG. 8(b) or a state in which only the earth pin 15 of the first earth mechanism 12-1 reaches the light shielding film 22 of the mask substrate 20. Then, the earth pin 15 of an earth mechanism 12 provided at a different position from the first earth mechanism 12-1 (the earth mechanism 12 will be denoted as second earth mechanism 12-2 in the following description) reaches the resist film 23 while tilted toward the mask substrate 20 (FIG. 9(a)). At this time, an angle of the earth pin 15 of the first earth mechanism 12-1 is θ2 smaller than θ1. That is, the earth pin 15 of the first earth mechanism 12-1 approaches substantially perpendicular to the mask substrate 20.

When the mask cover 10 is further lifted down, the earth pin 15 of the second earth mechanism 12-2 penetrates through the resist film 23 and reaches the light shielding film 22 (FIG. 9(b)). At this time, the angle of the earth pin 15 of the first earth mechanism 12-1 is θ3=0° much smaller than θ2. Then, the earth pin 15 of the second earth mechanism 12-2 penetrates through the resist film 23 while approaching an angle perpendicular to the mask substrate 20, and finally reaches the light shielding film 22 in a substantially perpendicular state to the mask substrate 20.

As described above with reference to FIG. 8 and FIG. 9, the mask cover 10 is placed on the mask substrate 20 such that the earth pins 15 of the earth mechanisms 12 provided therein penetrate through the resist film 23 one by one while tilted toward the mask substrate 20, and reach the light shielding film 22 of the mask substrate 20. The mask cover 10 is placed in this way so that each earth pin 15 reaching the light shielding film 22 of the mask substrate 20 in the tilted state is then substantially perpendicular to the mask substrate 20. Therefore, an unwanted material of the resist film 23 (the resist film 23 removed by penetration of the earth pins 15) is suppressed from being present between the tip ends of the earth pins 15 and the light shielding film 22.

To the contrary, when the mask cover 10 which is not tilted toward the mask substrate 20 (which is parallel with the mask substrate 20) is lifted down on the mask substrate 20, the mask cover 10 is placed on the mask substrate 20 such that all the earth pins 15 of the earth mechanisms 12 perpendicularly penetrate through the resist film 23 substantially at the same time and reach the light shielding film 22. Therefore, each earth pin 15 reaching the light shielding film 22 does not move thereafter and an unwanted material of the resist film 23 may be present between the tip end of the earth pin 15 and the light shielding film 22. In this case, the light shielding film 22 is not grounded and thus the mask substrate 20 is not suppressed from being charged.

That is, in order to increase the possibility that the earth pins 15 contact the light shielding film 22 when the mask cover 10 is placed on the mask substrate 20, according to the present embodiment, the mask cover 10 tilted toward the mask substrate 20 is lifted down on the mask substrate 20 thereby to place the mask cover 10 on the mask substrate 20.

In the present embodiment, particles generated due to penetration of the earth pins 15 through the resist film 23 accumulate in the gap 17 between the earth pins 15 and the cover part 13.

FIG. 7 will be referred to again. After the mask cover 10 is placed on the mask substrate 20 as described above, the mask substrate 20 on which the mask cover 10 is placed is transferred into the drawing chamber 31 (S105). The transferred mask substrate 20 is placed on the pins 42a of the stage 42 at a predetermined height with reference to the top face of the mask substrate 20 as illustrated in FIG. 6. At this time, the support pins 14b of the mask cover 10 contacts the grounded plate springs 42b so that the slight shielding film 22 of the mask substrate 20 is grounded.

Thereafter, drawing is performed on the mask substrate 20 (S106). Drawing on the mask substrate 20 is performed as follows. That is, when an electron beam 43 is emitted from the electron beam generation part 45 at first, the electron beam 43 is focused by the illumination lens 46c of the electron beam shape part 46 to irradiate the whole hole of the first aperture 46a. The electron beam 43 passing through the hole of the first aperture 46a is shaped to substantially equal to the shape of the hole of the first aperture 46a.

The electron beam 43 passing through the hole of the first aperture 46a is deflected by the shape deflector 46d to irradiate part of the hole of the second aperture 46b, and is focused by the projection lens 46e to irradiate part of the hole of the second aperture 46b. The electron beam 43 passing through the hole of the second aperture 46b is shaped to have a square or triangle horizontal cross-section.

The electron beam 43 shaped by the electron beam shape part 46 is deflected by the sub objective deflector 47b and the main objective deflector 47a in the electron beam deflection part 47 toward a desired position on the mask substrate 20, and is focused at a desired position by the objective lens 47c.

Drawing is performed on the mask substrate 20 placed on the stage 42 in this way. During drawing, the stage 42 on which the mask substrate 20 is placed is continually moving in the XY direction, for example. The electron beam 43 irradiated on the mask substrate 20 follows the mask substrate 20 which is placed on the continually moving stage 42 and is continually moving with the stage 42, and irradiates a predetermined position on the mask substrate 20.

When the drawing on the mask substrate 20 is terminated, the mask substrate 20 on which the mask cover 10 is placed is transferred into the mask cover housing chamber 35 by use of the vacuum transferring robot 36a (S107), and the mask cover 10 is removed from the mask substrate 20 inside the mask cover housing chamber 35 (S108). The removed mask cover 10 is stored in the mask cover housing chamber 35.

The mask substrate 20 with the mask cover 10 removed is transferred into the placement parts 32a of the carry-in/out part 32 through the load lock chamber 33 by use of the vacuum transferring robot 36a and the atmosphere transferring robot 32b (S109).

The electron beam drawing apparatus 30 draws on the mask substrate 20 in this way.

As described above, with the mask cover, the charged particle beam drawing apparatus and the charged particle beam drawing method according to the embodiment of the present invention, since the gap 17 is provided between the earth pin 15 of each earth mechanism 12 and the cover part 13, particles generated on penetration of the earth pin 15 through the resist film 23 are accumulated in the gap 17 between the earth pin 15 and the cover part 13. Therefore, the amount of particles adhered to the mask substrate 20 can be reduced, thereby suppressing a deterioration in drawing accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the present invention can be applied to all the charged particle beam irradiation apparatuses having a charged particle optical lens tube including an ion beam irradiation apparatus, not limited to an electron beam drawing apparatus. The charged particle optical lens tube has a part for generating a charged particle beam to be irradiated on a mask, a charged particle beam shape part for shaping a charged particle beam emitted from the charged particle beam generation part into a desired shape, and a charged particle beam deflection part for deflecting a charged particle beam shaped by the charged particle beam shape part in a desired direction.

What is claimed is:

1. A mask cover comprising:
   a frame body having an opening at the center,
   a conductive earth plate installed on the frame body such that its end protrudes into the opening of the frame body,
   an earth pin provided at the end of the earth plate and electrically connected to the earth plate, and
   a conductive cover part surrounding the earth pin such that the tip end of the earth pin protrudes and a gap is present between the cover part and the earth pin.

2. The mask cover according to claim 1, wherein the earth plate and the cover part are made of any of $ZrO_2$—TiN, SiC, WC and TiC.

3. The mask cover according to claim 1, wherein the gap between the earth pin and the cover part is wider toward the tip end of the earth pin.

4. The mask cover according to claim 1, further comprising a conductive support pin electrically connected to the earth plate and supporting the earth plate.

5. The mask cover according to claim 1, wherein the frame body is such that a conductive film is formed on a surface of a low magnetic material made of any of $AlO_2$, $ZrO_2$ and SiC.

6. The mask cover according to claim 5, wherein the conductive film is made of TiN.

7. A charged particle beam drawing apparatus comprising:
   a first chamber for placing, on a mask in which a resist film is formed on a light shielding film, a mask cover having a frame body with an opening at the center, a conductive earth plate installed on the frame body such that its end protrudes into the opening of the frame body, an earth pin provided at the end of the earth plate and electrically connected to the earth plate, and a conductive cover part surrounding the earth pin such that the tip end of the earth pin protrudes and a gap is present between the cover part and the earth pin, and
   a second chamber comprising an electrode for grounding the earth pin contacting the light shielding film and irradiating the mask on which the mask cover is placed with a charged particle beam.

8. The charged particle beam drawing apparatus according to claim 7, wherein the earth plate and the cover part in the mask cover are made of any of $ZrO_2$—TiN, SiC, WC and TiC.

9. The charged particle beam drawing apparatus according to claim 7, wherein the gap between the earth pin and the cover part is wider toward the tip end of the earth pin.

10. The charged particle beam drawing apparatus according to claim 7, wherein the mask cover further has a conductive support pin electrically connected to the earth plate and supporting the earth plate, and
    the support pin contacts the electrode provided in the second chamber so that the light shielding film of the mask is grounded.

11. The charged particle beam drawing apparatus according to claim 7, wherein the frame body of the mask cover is such that a conductive film is formed on a surface of a low magnetic material made of any of $AlO_2$, $ZrO_2$ and SiC.

12. The charged particle beam drawing apparatus according to claim 11, wherein the conductive film is made of TiN.

* * * * *